(12) United States Patent
Ahmad

(10) Patent No.: US 7,502,272 B2
(45) Date of Patent: Mar. 10, 2009

(54) SELF-TIMING READ ARCHITECTURE FOR SEMICONDUCTOR MEMORY AND METHOD FOR PROVIDING THE SAME

(75) Inventor: Nasim Ahmad, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/616,499

(22) Filed: Dec. 27, 2006

(65) Prior Publication Data

US 2008/0144401 A1   Jun. 19, 2008

(30) Foreign Application Priority Data

Dec. 30, 2005   (IN)   .................. 3548/DEL/2005

(51) Int. Cl.
*G11C 7/02* (2006.01)
(52) U.S. Cl. ............... 365/210.1; 365/211; 365/189.14; 365/230.06; 365/200
(58) Field of Classification Search ................. 365/200, 365/210, 211, 189.14, 230.06
See application file for complete search history.

(56) References Cited

U.S. PATENT DOCUMENTS

| 7,230,872 | B2 * | 6/2007 | Winograd et al. | ...... 365/230.03 |
| 2005/0141325 | A1 * | 6/2005 | Winograd et al. | ...... 365/230.03 |

* cited by examiner

*Primary Examiner*—Thong Q Le
(74) *Attorney, Agent, or Firm*—Lisa K. Jorgenson; E. Russell Tarleton; Seed IP Law Group PLLC

(57) ABSTRACT

A semiconductor memory device having a control circuit, decoder circuit, a dummy column, and a normal memory cell array divided in clusters of N consecutive rows, where N can be one or more than one, and for each cluster of N rows a common circuitry is used in block with a dummy bit line connected to the dummy column and to a timing circuit. A normal bit line connected to the normal memory cells provides the read normal bit to input/output logic. Whenever a normal memory cell is accessed during the read operation, the circuitry of the corresponding dummy row enables the dummy bit line to discharge, and when the voltage across the dummy bit line reaches a predetermined value, the timing circuit produces a timing signal to activate the input/output circuitry to read the data stored in the accessed memory cell.

16 Claims, 3 Drawing Sheets

SELF-TIMING READ ARCHITECTURE FOR SEMICONDUCTOR MEMORY AND METHOD FOR PROVIDING THE SAME

BACKGROUND OF THE INVENTION

1. Field of Invention

The present invention relates to self-timing read architecture for a semiconductor memory device.

2. Description of the Related Art

A semiconductor memory is composed of data storage cells arranged in rows and columns. The process of reading from the memory is accomplished by means of control, address and input/output signals. At the time of reading, a set of external control signals and a clock are activated. The memory cell from which the data is to be read is accessed and then the data is read by the read circuitry connected between the output data lines of the memory.

The read circuitry performs the reading operation by sensing the voltage difference developed across the data lines. However, in order to ensure that desired data is read correctly, the read operation should be performed only when a sufficient voltage differential has been developed across the data lines. This is done by ensuring a predetermined time delay between accessing the memory cell and reading the bit value. This time delay is controlled by a timing circuit coupled to the read circuitry. The time delay can be determined by the memory structure and its likely behavior, i.e., likely time for a sufficient voltage difference to be developed, is known. However, the memory behavior depends on other factors such as memory size and PVT (process voltage and temperature conditions). Moreover, since different process tolerances are involved in the manufacture of memories, this means that any two memories may not have identical behavior.

To overcome the above-mentioned problems, "dummy cells" have been successfully used in semiconductor memory devices. These cells are provided in the memory region of the semiconductor device and have the same structure as the actual memory cells. As a result, it takes the same time for a predetermined voltage differential to be developed across a dummy bit line as in the case of normal bit line. This fact can be exploited to make the timing circuit responsive to the operating conditions of the memory. The timing circuit receives the voltage developed on the dummy bit line as a control input. It produces a timing signal when the voltage developed on dummy bit line reaches a predetermined value. The timing signal, also known as 'sense-on' signal, then simulates the read circuitry to read the voltage across the normal bit line.

In one of the configurations commonly used, the dummy memory cell is provided farther away than the memory cell, which is farthest away from the control circuit. As a result, the path along which the dummy memory cell signal is retrieved has a timing delay that is longer than that of the critical path that has the longest timing delay in the memory cell array. This ensures that the process of reading the data from all memory cells is properly performed. However, in this configuration the load of driving the dummy bit line is greater than the maximum load that can be incurred when reading data from a normal memory cell. This leads to a problem of higher power consumption.

To overcome this problem, another configuration was introduced in which the dummy memory cell and its associated circuitry are situated at a corner of the memory cell array closest to the control circuit. As a result, the dummy path for emulating a data access path can be implemented as a relatively shorter path, which results in dummy drive circuit having a smaller drive capacity than the signal drive circuit.

However, in all the above mentioned configurations, since the discharge circuit for a normal bit line depends on the position of the normal memory cell that is accessed and the discharge circuit for the dummy bit line is fixed, the dummy bit line and the normal bit line have different resistances. Also, the vertical process gradient causes mismatch between the dummy discharge cell and the normal discharge cell. Since the position of the normal memory cell accessed in every read operation is different, this leads to statistical deviation between predetermined voltage creation on the bit line and the 'sense-on' signal arrival. This in turn reduces the speed of the operation of the memory device.

Therefore, there is a need for a semiconductor memory device that is provided with a self-timing circuit so as to ensure stability against variation in operating conditions where the self-timing circuit ensures high speed and robustness.

BRIEF SUMMARY OF THE INVENTION

The present disclosure is directed to a semiconductor memory device with a self-timing circuit that provides stability against variation in operating conditions and at the same time ensures high speed of operation and robustness.

In one embodiment, a semiconductor memory device is provided that includes a control circuit, a decoder circuit, a timing circuit, output circuitry, and a memory region. Each memory array of the memory region is divided into clusters of N consecutive memory cells. One of the memory arrays is a dummy array and each cluster of dummy arrays shares a common circuitry. The number of dummy memory cells in a cluster determines the relationship between the voltage developed on the dummy bit line and the normal bit line. Whenever a normal memory cell is accessed during the read operation, the circuitry of the corresponding dummy row enables the dummy bit line to discharge. When the voltage across the dummy bit line reaches a predetermined value, a timing signal, also known as sense-on signal, is produced by a timing circuit present in the memory device. On receiving the sense-on signal, the output circuitry of the memory device reads the voltage across the normal bit line, which is the data stored in the normal memory cell that is accessed.

Since the discharge of the dummy bit line occurs by the circuitry that is close to the accessed normal memory cell, the resistance on the dummy bit line and the normal bit line is always the same. This prevents any mismatch between the dummy discharge cell and the normal memory cell due to process gradient. Moreover, the statistical deviation between the predetermined voltage created on the bit line and the arrival of the 'sense-on' signal is also very small. All these factors provide high speed and robustness to the memory device. An additional advantage of the clustered dummy cells is that the relationship between the voltages developed on the dummy bit line and the normal bit line can be changed by simply changing the number of dummy memory cells in a particular cluster. Therefore the time delay between accessing a normal memory cell and reading the data stored in the accessed memory cell can be controlled easily by controlling the number of dummy memory cells in a particular cluster.

To achieve the aforesaid, the present disclosure provides a self-timing read architecture for a semiconductor memory device that includes an array of storage cells grouped into at least one cluster; at least one dummy cell corresponding to each of the clusters, located in a manner such that the electrical characteristics of the dummy cells remain in constant proportion to the like characteristics of the corresponding cluster over the operating temperature range and manufacturing process variations; at least one decoder for simultaneously enabling the output of a desired set of storage cells within a single cluster over a storage cell output bus and the output of the dummy cells corresponding to said cluster over a dummy cell output bus; at least one output detector coupled to the dummy cell output bus for signaling the availability of valid output data during a read operation; read circuitry coupled to the storage cell output bus and enabled by the output of said detectors; and output drive circuitry coupled to the output of said read circuitry.

The dummy cells can be storage cells or logic circuits. The read access time of the dummy cells is preferably the same as the read access time of storage cells in the corresponding cluster. The read access time of the storage cells in the corresponding cluster has a predefined value.

In one embodiment, the output detector is a voltage detector. In another embodiment, the read circuitry is a set of sense amplifiers. In yet another embodiment, the detectors trigger a timing circuit for enabling the read circuitry.

Further the disclosure provides a method for making a self-timing read architecture for a semiconductor memory device that includes the steps of arranging the array of storage cells in clusters; providing at least one dummy cell corresponding to each of the clusters, located in a manner such that the electrical characteristics of the dummy cells remain in constant proportion to the like characteristics of the corresponding cluster over the operating temperature range and manufacturing process variations; simultaneously enabling the output of a desired set of storage cells within a single cluster over a storage cell output bus and the output of the dummy cells corresponding to said cluster over a dummy cell output bus; monitoring the dummy cell output bus and signaling the availability of valid output data during a read operation; enabling read circuitry coupled to the storage cell output bus based on the output of said detectors; and coupling output drive circuitry to the output of said read circuitry.

The signaling is ideally based on the voltage level of the dummy cell output bus. In another embodiment, the read circuitry is enabled using a timing sequence triggered by the signal.

In accordance with another embodiment, a circuit is provided that includes a plurality of memory cells arranged in clusters, each cluster including at least one dummy circuit physically associated with each cluster of memory cells, a first bit line coupled to each memory cell in the cluster, a second bit line coupled to the dummy circuit in the cluster, and a common circuit coupled to each memory cell in the cluster and to the dummy circuit in the cluster and configured to discharge the second bit line in response to a read signal.

In accordance with another aspect of the foregoing embodiment, the circuit includes an activation circuit adapted to determine a discharge voltage on the dummy circuit and to activate a sensing circuit when the discharge voltage in the dummy circuit reaches a set value. Ideally the dummy circuit is in close physical location to the memory cells in the cluster and to the first bit line to minimize differences in resistance between the first bit line and the second bit line.

In accordance with another embodiment, a memory circuit is provided that includes a plurality of memory cells arranged in clusters, each cluster including a normal bit line coupled to each memory cell in the cluster; a dummy circuit having a dummy bit line formed in close physical associated with the normal bit line to minimize differences in resistance between the normal bit line and the dummy bit line, a common circuit coupled to each memory cell and the dummy circuit and configured to discharge the dummy bit line in response to a read signal, a single control circuit coupled to the clusters of memory cells and adapted to receive the read signal, a timer circuit coupled to the dummy bit line and adapted to determine a discharge voltage on the dummy bit line and to generate a sense-on signal, a sensing circuit coupled to the timer circuit and adapted to read data from the memory cells in each cluster that are selected by the read signal in response to the sense-on signal generated by the timing circuit.

In accordance with another aspect of the foregoing embodiment, the read signal consists of a clock signal. Ideally, the memory circuit includes a decoder circuit that selectively activates a word line associated with the plurality of memory cells in accordance to the address supplied by the control circuit and to supply a read signal to an addressed memory cell.

BRIEF DESCRIPTION OF THE SEVERAL VIEWS OF THE DRAWINGS

The advantages and features of the foregoing embodiments are described in detail below in conjunction with the accompanying drawings, wherein.

DETAIL DESCRIPTION OF THE INVENTION

Figure 1:
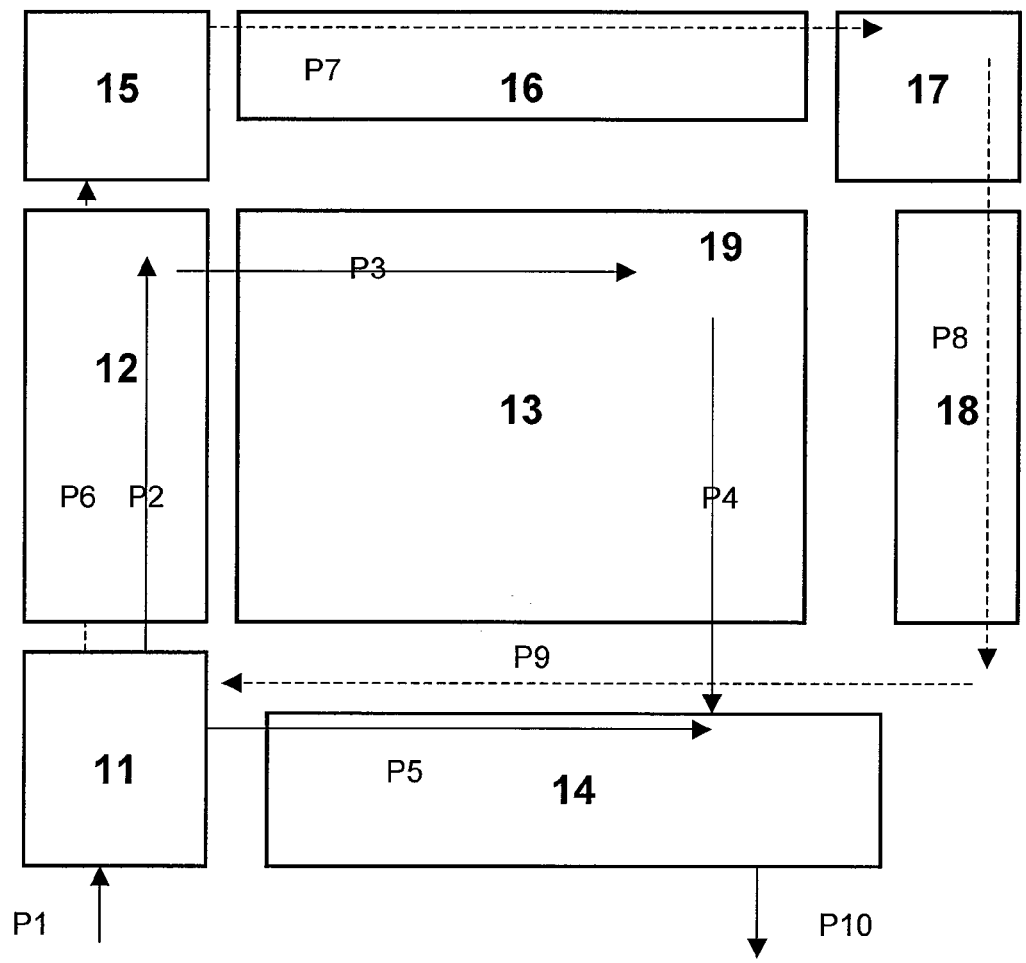
FIG. 1 shows the block diagram of a known semiconductor memory device.

FIG. 1 shows the block diagram of a semiconductor memory device presently used. The device includes a control circuit 11, a decoder circuit 12, a memory cell array 13, a read write amplifier 14, a dummy word decoder 15, a dummy word line 16, a dummy memory cell 17, and a dummy bit line 18. During a read operation, the decoder circuit 12 selectively activates a word line of a memory cell array 13 when a clock signal and an address signal are supplied to the control circuit 11 from an exterior of the device. The decoder circuit supplies a read signal to a memory cell 19. The read signal propagates along the path P1, P2, P3. Data read from the memory cell 19 is then supplied to the read—write amplifier through a path P4. In parallel the dummy word decoder 15 activates the dummy word line 16 based on a clock signal CK, and the address signal ADDRESS supplied to the control circuit 11 from the exterior of the device, thereby supplying a read signal to the dummy memory cell 17. The path along which this read signal propagates is shown as P1, P6, and P7. A dummy memory cell signal read from the dummy memory cell 17 is supplied through the dummy bit line 18 to the control circuit 11. Based on this dummy memory sense signal, the control circuit 11 supplies a sense-on signal to read write amplifier 14 so as to amplify the data that is read. The path along which the dummy memory cell signal and sense-on signal propagate is shown as paths P8, P9 and P5. The data is then output to the exterior of the device through path P10. The path along which the dummy memory cell signal is retrieved has a timing delay longer than that of the critical path that has the longest timing delay in the memory cell array 13. This ensures that the reading of data along any path is properly performed.

In the configuration described above, the dummy memory cell 17 is provided farther away than the memory cell that is farthest away from the control circuit 11. As a result, the load of driving the dummy word decoder 15, the dummy word line 16, the dummy bit line 18 etc. is greater than the maximum load that can be incurred when reading data from the memory cell array 13. Therefore the power consumption by the self-timing circuit increases. In order to overcome this drawback, another configuration is used. It is shown in FIG. 2.

Figure 2:
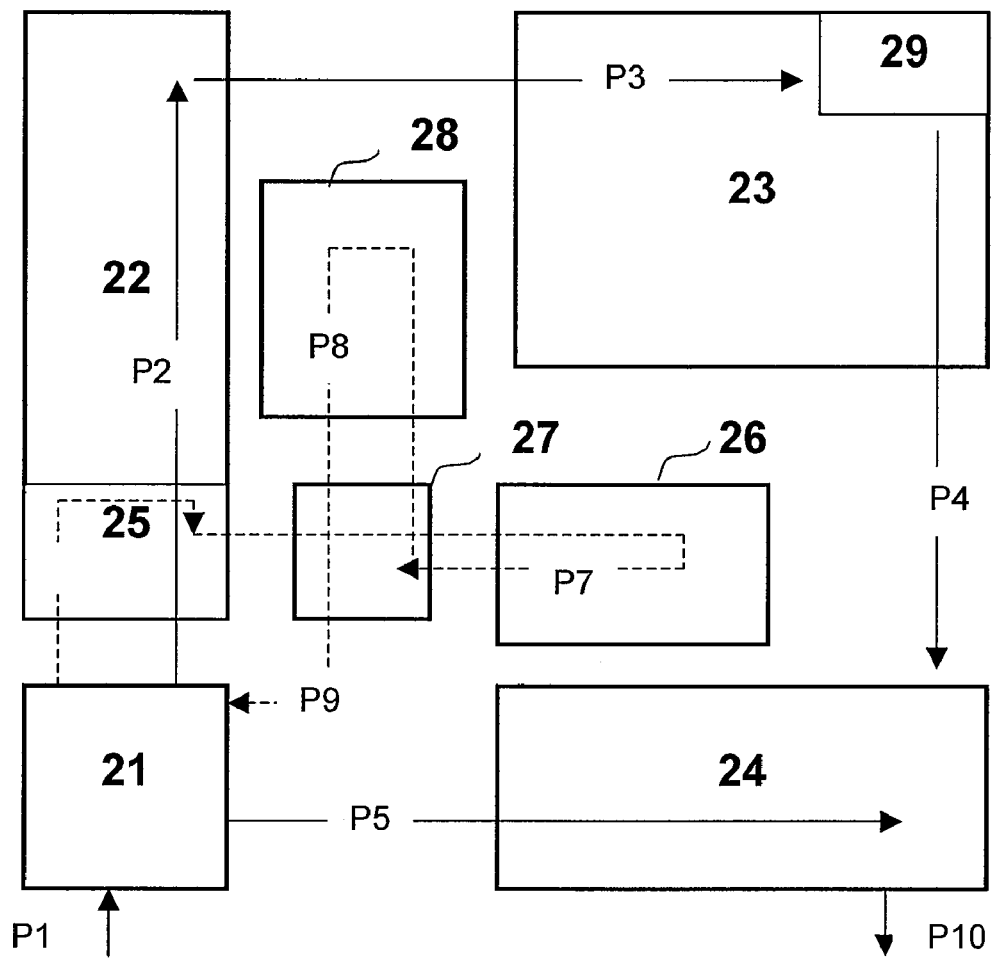
FIG. 2 shows the block diagram of another configuration of a known semiconductor memory device.

FIG. 2 illustrates another configuration of a semiconductor memory device designed to overcome the drawbacks of the configuration shown in FIG. 1. The device consists of a control circuit 21, decoder circuit 22, memory cell array 23, read write amplifier 24, dummy word decoder 25, dummy word line 26, dummy memory cell 27, and a dummy bit line circuit 28. The dummy word decoder 25, the dummy word line circuit 26, the dummy memory cell 27, and the dummy bit line circuit 28 together constitute a self-timing circuit. In the present configuration, the dummy word decoder 25, the dummy word line circuit 26, the dummy memory cell 27 and the dummy bit line circuit are situated at a position closer to the control circuit 21 than the memory cell array 23. P1, P2, P3 and P4 together form the data retrieval path. The path along which the read signal for the dummy memory cell propagates is shown as paths P1, P6, and P7. The path along which the dummy memory cell signal and the sense-on signal propagate is shown as paths P8, P9 and P5. The data is then output to the exterior of the device through a path P10. In this configuration, since the self-timing circuit is provided at a position that is closest to the word decoder and the read write amplifier, the circuit consumes less power.

Although, the above-mentioned configuration overcomes the drawbacks of the device shown in FIG. 1, both of the known configurations explained above still have some shortcomings. In both these configurations, the position of the dummy memory cell is fixed whereas the position of a normal memory cell accessed varies with each read operation. As a result, the dummy bit line resistance becomes fixed whereas the resistance of normal bit line varies depending upon the row accessed. Also, the vertical process gradient causes a mismatch between the dummy discharge cell and the normal discharge cell. Moreover, since the position of the normal memory cell accessed in every read operation changes, a statistical deviation between predetermined voltage creation on a bit line and 'sense-on' signal arrival is created.

Figure 3:
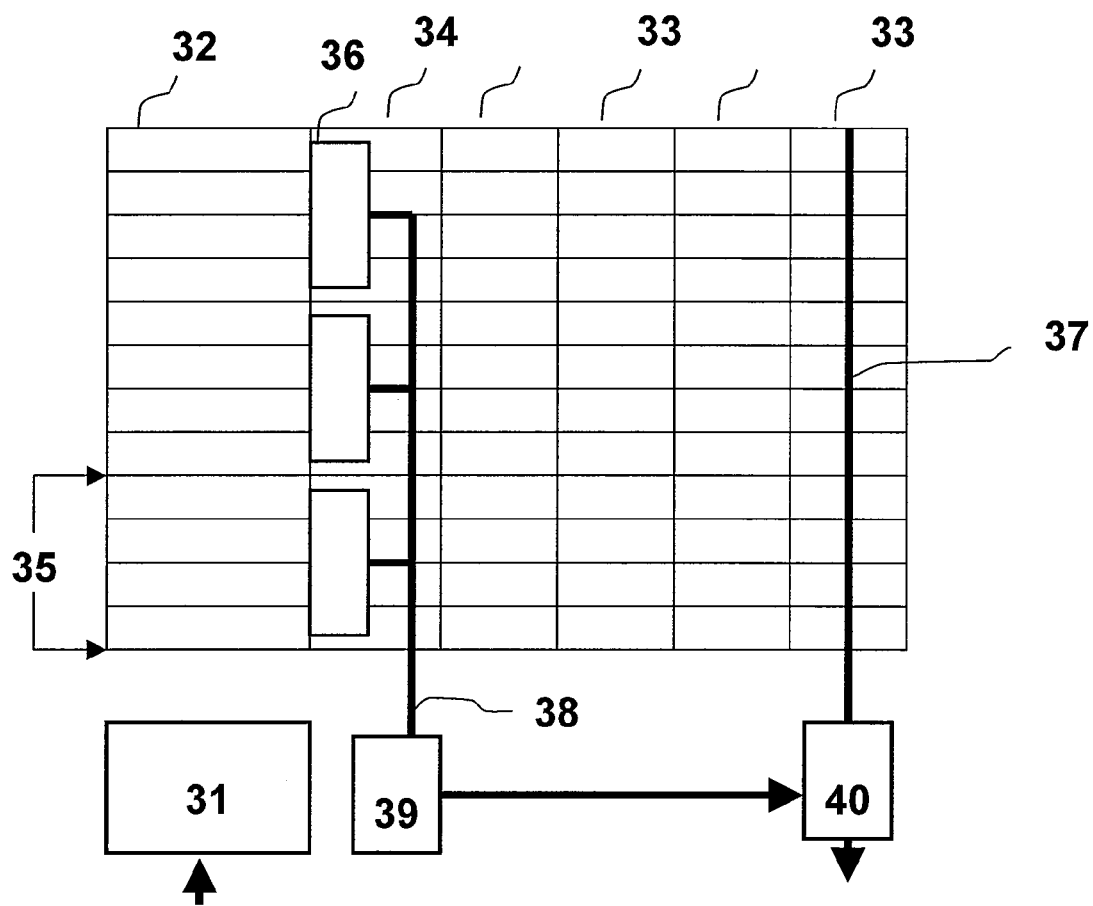
FIG. 3 shows the block diagram of the semiconductor memory device of the present disclosure.

To overcome the shortcomings of the prior art, a novel semiconductor memory device is disclosed herein. One embodiment is shown in FIG. 3. The device 30 consists of a control circuit 31, a decoder circuit 32, a normal memory cell array 33, and a dummy column 34. The dummy column 34 may include memory cells or any logic devices. The memory array is divided in clusters 35 of N consecutive rows. For each cluster of N rows a common circuitry is used in block 36. A dummy bit line 38 is connected to the dummy column and a timing circuit 39. A normal bit line 37 connected to the normal memory cells 33 provides the read normal bit to an input/output logic 40.

During a read operation, a clock signal and an address signal are supplied to the control circuit 31 from an exterior of the device. The decoder logic 32 then selectively activates a word line of a memory cell array 33 according to the address supplied to the control circuit 31. The decoder circuit 32 supplies a read signal to a normal memory cell 33. The circuitry of the block 36 of the cluster corresponding to the normal cell accessed enables the dummy bit line 38 to discharge. When the voltage across the dummy bit line 38 reaches a predetermined value, a 'sense-on' signal is generated by the timing circuit 39. This signal activates the sensing circuitry in input/output logic 40 to read the normal memory cell 33 data. The discharge rate of the dummy bit line 38 and hence the time at which the sense-on signal is generated depends on the logic device used in block 36.

In the present configuration, the time delay between the clock pulse and the generation of the sense-on signal depends on the discharge rate of the dummy bit line 38. The discharge rate in turn varies with the process voltage and temperature conditions and also with memory size. However, since the increase or decrease in discharge rate happens both in the dummy bit line 38 and the normal bit line 37, therefore, the time delay varies with the variation in operating conditions and the memory size. Hence, read self-timing is achieved.

Moreover, the discharge of the dummy bit line 38 is enabled by the circuitry that corresponds to the row of the normal cell 33 that is accessed. As a result, the dummy bit line 38 discharge circuit is always close to the accessed row. This results in the same resistance on the normal bit line 37 and the dummy bit line 38. This in turn prevents any mismatch between the dummy discharge cell and the normal memory cell due to the process gradient as seen in memory devices shown in FIG. 1 and FIG. 2. Moreover, there is very small statistical deviation between the predetermined voltage creation on the bit line and the arrival of the 'sense-on' signal. This reduction in the statistical deviation enables the memory device to attain a high speed and robustness.

In a preferred embodiment, the dummy column 34 includes dummy memory cells that have the same structure as that of the normal memory cells 33. The relationship between the voltage developed on the dummy bit line 38 and the voltage differential developed between the bit lines of the normal memory cell depends on the number of dummy cells in a particular cluster. As a result, this relationship can be easily changed by simply changing the number of dummy memory cells in a particular cluster.

Moreover, the discharge rate of the dummy bit line 38 may be altered by keeping one or more of the dummy cells in a cluster blank. The rest of the dummy cells in a cluster have the same structure as that of the normal memory cell 33. By doing so, the load on the dummy bit line 38 can be reduced. This in turn reduces the discharge time of the dummy bit line 38. Similarly, the load on the dummy bit line 38 may be increased by decreasing the number of blank dummy cells.

Another advantage of having dummy clusters corresponding to each normal memory cell 33 is that the circuitry used for selection of a normal memory cell 33 and the circuitry for sending a signal to the dummy cell is common to the dummy clusters. As a result, variation in the signal strength occurring due to variations in the operating conditions is same for these two signals.

It is to be understood that the above-described configurations are only illustrative of the application of the principles of the present invention. Numerous modifications and alternative configurations may be devised by those skilled in the art without departing from the scope of the present invention, and the appended claims are intended to cover such modifications and arrangements.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A self-timing read architecture for a semiconductor memory device comprising:
    an array of storage cells grouped into at least one cluster;
    at least one dummy cell corresponding to each of the clusters and located in a manner such that the electrical characteristics of the at least one dummy cell in each of the clusters remain in constant proportion to the like characteristics of the corresponding cluster over the operating temperature range and manufacturing process variations;
    at least one decoder for simultaneously enabling the output of a desired set of storage cells within a single cluster over a storage cell output bus and further comprising a common circuit adapted to enable the output of the at least one dummy cell corresponding to said cluster over a dummy cell output bus;
    at least one output detector coupled to the dummy cell output bus for signaling the availability of valid output data during a read operation; and
    read circuitry coupled to the storage cell output bus and enabled by the output of said at least one output detector.

2. The self-timing read architecture for a semiconductor memory device of claim 1 wherein said at least one dummy cell is a storage cell.

3. The self-timing read architecture for a semiconductor memory device of claim 1 wherein said at least one dummy cell is a logic circuit.

4. The self-timing read architecture for a semiconductor memory device of claim 1 wherein the read access time of the at least one dummy cell is the same as the read access time of storage cells in the corresponding cluster.

5. The self-timing read architecture for a semiconductor memory device of claim 1 wherein the read access time of the storage cells in the corresponding cluster is determined by a predefined value.

6. The self-timing read architecture for a semiconductor memory device of claim 1 wherein said at least one output detector comprises a voltage detector.

7. The self-timing read architecture for a semiconductor memory device of claim 1 wherein said read circuitry comprises a set of sense amplifiers.

8. The self-timing read architecture for a semiconductor memory device of claim 1 wherein the at least one detector are adapted to trigger a timing circuit for enabling the read circuitry.

9. A method for providing a self-timing read architecture for a semiconductor memory device, comprising the steps of:
    arranging the array of storage cells in clusters;
    providing at least one dummy cell corresponding to each of the clusters, located in a manner such that the electrical characteristics of the at least one dummy cell remain in constant proportion to the like characteristics of the corresponding cluster over the operating temperature range and manufacturing process variations;
    simultaneously enabling the output of a desired set of storage cells within a single cluster over a storage cell output bus and the output of the at least one dummy cell corresponding to said cluster over a dummy cell output bus;
    monitoring the dummy cell output bus with at least one detector and signaling the availability of valid output data with a signal during a read operation;
    enabling read circuitry coupled to the storage cell output bus based on the output of said at least one detector; and
    coupling output drive circuitry to the output of said read circuitry.

10. The method for providing a self-timing read architecture for a semiconductor memory device of claim 9 wherein said signaling is based on the voltage level of the dummy cell output bus.

11. The method for providing a self-timing read architecture for a semiconductor memory device of claim 9 wherein the read circuitry is enabled using a timing sequence triggered by said signal.

12. A circuit, comprising:
    a plurality of memory cells arranged in clusters, each cluster comprising:
        at least one dummy circuit physically associated with each cluster of memory cells;
        a first bit line coupled to each memory cell in the cluster;
        a second bit line coupled to the dummy circuit in the cluster;
        a common circuit coupled to each memory cell in the cluster and to the dummy circuit in the cluster and configured to discharge the second bit line in response to a read signal; and an activation circuit adapted to determine a discharge voltage on the dummy circuit and to activate a sensing circuit when the discharge voltage in the dummy circuit reaches a set value, the sensing circuit coupled to the memory cells in the cluster to read a value of a selected memory cell in response to discharge of the second bit line in the dummy circuit.

13. The circuit of claim 12 wherein the dummy circuit is formed in close physical location to the memory cells in the cluster and to the first bit line to minimize differences in resistance of the first bit line and the second bit line.

14. A memory circuit, comprising:
    a plurality of memory cells arranged in clusters, each cluster comprising:
        a normal bit line coupled to each memory cell in the cluster;
        a dummy circuit having a dummy bit line formed in close physical associated with the normal bit line to minimize differences in resistance between the normal bit line and the dummy bit line;
        a common circuit coupled to each memory cell and the dummy circuit and configured to discharge the dummy bit line in response to a read signal;
    a single control circuit coupled to the clusters of memory cells and adapted to receive the read signal;
    a timer circuit coupled to the dummy bit line and adapted to determine a discharge voltage on the dummy bit line and to generate a sense-on signal;
    a sensing circuit coupled to the timer circuit and adapted to read data from the memory cells in each cluster that are selected by the read signal in response to the sense-on signal generated by the timing circuit.

15. The memory circuit of claim 14 wherein the read signal comprises a clock signal and an address signal that are received by the control circuit.

16. The memory circuit of claim 14, comprising a decoder circuit coupled to the control circuit and to the plurality of memory cells to selectively activate a word line of the memory cells in response to a signal from the control circuit.

* * * * *